(12) United States Patent
Chevallier

(10) Patent No.: US 6,188,595 B1
(45) Date of Patent: Feb. 13, 2001

(54) MEMORY ARCHITECTURE AND ADDRESSING FOR OPTIMIZED DENSITY IN INTEGRATED CIRCUIT PACKAGE OR ON CIRCUIT BOARD

(75) Inventor: Christophe J. Chevallier, Palo Alto, CA (US)

(73) Assignee: Micron Technology, Inc., Boise, ID (US)

( * ) Notice: Under 35 U.S.C. 154(b), the term of this patent shall be extended for 0 days.

(21) Appl. No.: 09/107,379

(22) Filed: Jun. 30, 1998

(51) Int. Cl.⁷ .................................................. G11C 5/05
(52) U.S. Cl. ...................... 365/51; 365/63; 365/230.03; 361/760; 361/761; 361/764
(58) Field of Search .................... 365/51, 63, 230.03; 361/736, 760, 761, 764

(56) References Cited

U.S. PATENT DOCUMENTS

| | | | |
|---|---|---|---|
| 5,680,342 | * | 10/1997 | Frankeny .................................. 365/52 |
| 5,936,877 | * | 8/1999 | Morgan et al. ........................... 365/51 |
| 5,953,215 | * | 9/1999 | Karabatsos ............................. 361/767 |

* cited by examiner

*Primary Examiner*—Andrew Q. Tran
(74) *Attorney, Agent, or Firm*—Schwegman, Lundberg, Woessner & Kluth, P.A.

(57) ABSTRACT

An electrically erasable and programmable read only memory (EEPROM) or other memory integrated circuit (IC) includes memory cells arranged in N blocks. The number of blocks, N, is selected to maximize utilization of the space available in a standard IC package. The number of blocks need not be an even power of two. More than $\log_2(N)$ address bits are used to select between the blocks. A plurality of such memory ICs forms an array addressed by a memory controller, providing a number of directly addressable memory locations that need not be an even power of two. Addressing is provided for decoding chip select lines, block select lines, and other address lines. Staggered block decode lines associated with the memory blocks allow juxtaposition of the blocks to form a row in which connections are easily verified.

31 Claims, 5 Drawing Sheets

MEMORY ARCHITECTURE AND ADDRESSING FOR OPTIMIZED DENSITY IN INTEGRATED CIRCUIT PACKAGE OR ON CIRCUIT BOARD

TECHNICAL FIELD OF THE INVENTION

This invention relates generally to integrated circuit memories and particularly, but not by way of limitation, to a memory architecture and addressing for optimized storage density in an integrated circuit package or on a circuit board.

BACKGROUND OF THE INVENTION

Computer systems, communications systems, and other electronic devices often utilize integrated circuit memories for storing data. For example, dynamic random access memories (DRAMs) provide dense solid-state data storage that is quickly accessed for reading or writing. DRAMs are a volatile form of memory; stored data is lost when power is removed. DRAMs also must typically be refreshed in order to maintain the stored data. In another example, static random access memories (SRAMs) provide volatile data storage that avoids any periodic refresh requirement. "Flash" and other electrically erasable and programmable read-only memories (EEPROMs) provide nonvolatile data storage; stored data is maintained when power is removed. Access and programming times may be longer for EEPROMs than for DRAMs. Other types of commercial memory integrated circuits are also available.

Many applications require large amounts of memory capacity in order to meet data storage requirements. For many such applications, several memory integrated circuits are each individually disposed in an integrated circuit package, and the packages are mounted on a printed circuit board. The printed circuit board is then plugged into an available slot in the computer system or other electronic device such that a microprocessor can access the memory integrated circuits for storing and retrieving data. For applications requiring even larger amounts of memory capacity, several such printed circuit boards carrying memory integrated circuits are plugged into available slots for use by the computer system or other electronic device.

Modem computer systems, communications systems, and other electronic devices demand a high degree of functionality in a minimum volume, for portability and other reasons. Moreover, the electronics industry often uses standardized integrated circuit packages, so that system designers can design and build a computer system using standard components. Because the "footprint" of a standardized integrated circuit package (i.e., its size, connection locations, etc.) is known, the system designer can design the other portions of the computer system assuming a standard integrated circuit package. Thus, a computer system can be designed even before the design of the actual memory integrated circuits carried within the standard integrated circuit package. Such flexibility is particularly important in the computer industry, in which product design cycles are extremely short. Products not timely introduced with the maximum available functionality may not be marketable. Thus, there is a strong need for electronics products that are designed with standardized integrated circuit packages, but which offer maximum functionality while occupying a minimum volume.

SUMMARY OF THE INVENTION

The present invention provides, among other things, an integrated circuit (IC) architecture that optimizes memory storage density, such as for a particular size of standard IC package. This increases memory density per unit volume and advantageously allows design of a computer, communication, or other electronic system using standard IC packages while the memory IC is concurrently being designed. This enables timely introduction of high storage density products onto a highly competitive electronics market.

In one embodiment, the invention provides, among other things, an apparatus including a memory integrated circuit (IC), and an IC carrier. The memory IC includes a plurality of N memory blocks arranged in a row in a first dimension, wherein $\log_2(N)$ is a noninteger. The memory blocks include a block size $B_1$ in the first dimension. Each memory block include a plurality of memory cells. The IC carrier includes an area carrying the memory IC. The area includes a size $C_1$ in the first dimension, and the memory IC includes a die size $D_1$ in the first dimension, wherein $(C_1-D_1)$ is approximately less than $B_1$. In one embodiment, the apparatus also includes a computer system including a processor communicatively coupled to the memory IC. In a further embodiment, the apparatus also includes a plurality of the memory ICs, a memory controller coupled to the memory ICs, and a processor coupled to the memory controller.

Another aspect of the invention provides, among other things, an apparatus that includes a plurality of X memory ICs. Each memory IC includes Y directly addressable storage locations, wherein $\log_2(Y)$ is a noninteger. The apparatus also includes a memory controller. The memory controller decodes A address inputs into (X)(Y) addresses, leaving $(2)^A - \{(X)(Y)\}$ addresses unused. In one embodiment, each memory IC includes a chip select input and a plurality of other memory cell address inputs. Data is accessed on a particular one of the memory ICs only when the chip select input is active. The memory controller is independently coupled to each chip select input, selecting between the chip select inputs by decoding a number Z of the A address inputs, wherein $Z > \log_2(X)$. In one embodiment, using memory ICs having some memory cells that are not functional, the addressing is used to decode Y directly addressable functional storage locations, wherein $\log_2(Y)$ is a noninteger.

Another aspect of the invention provides, among other things, a method that includes forming an integrated circuit (IC). The IC includes a plurality of N memory blocks arranged in a row in a first dimension, wherein $\log_2(N)$ is a noninteger. The memory IC has a die size $D_1$ in the first dimension. The memory blocks include a block size $B_1$ in the first dimension. Each memory block including a plurality of memory cells. The method also includes disposing the memory IC on an area of an IC carrier. The area has a size $C_1$ in the first dimension, wherein $(C_1-D_1)$ is approximately less than $B_1$.

The present invention minimizes space wasted by putting a too-small memory IC in a particular standard IC package. Instead, the number of memory blocks is increased such that the memory die size uses more of the available space, providing correspondingly more storage capacity. Many applications exist for the present invention. For example, the packaged memory ICs can be arranged on a printed circuit board (PCB), such as a Personal Computer Memory Card International Association (PCMCIA) card, providing a removable, high density, high capacity, credit-card size nonvolatile flash memory for laptop computers or other applications. These and other advantages will become apparent upon reading the following detailed description of the invention and viewing the accompanying drawings.

BRIEF DESCRIPTION OF THE DRAWINGS

In the drawings, like numerals describe substantially similar components throughout the several views.

DETAILED DESCRIPTION OF THE INVENTION

Figure 1:
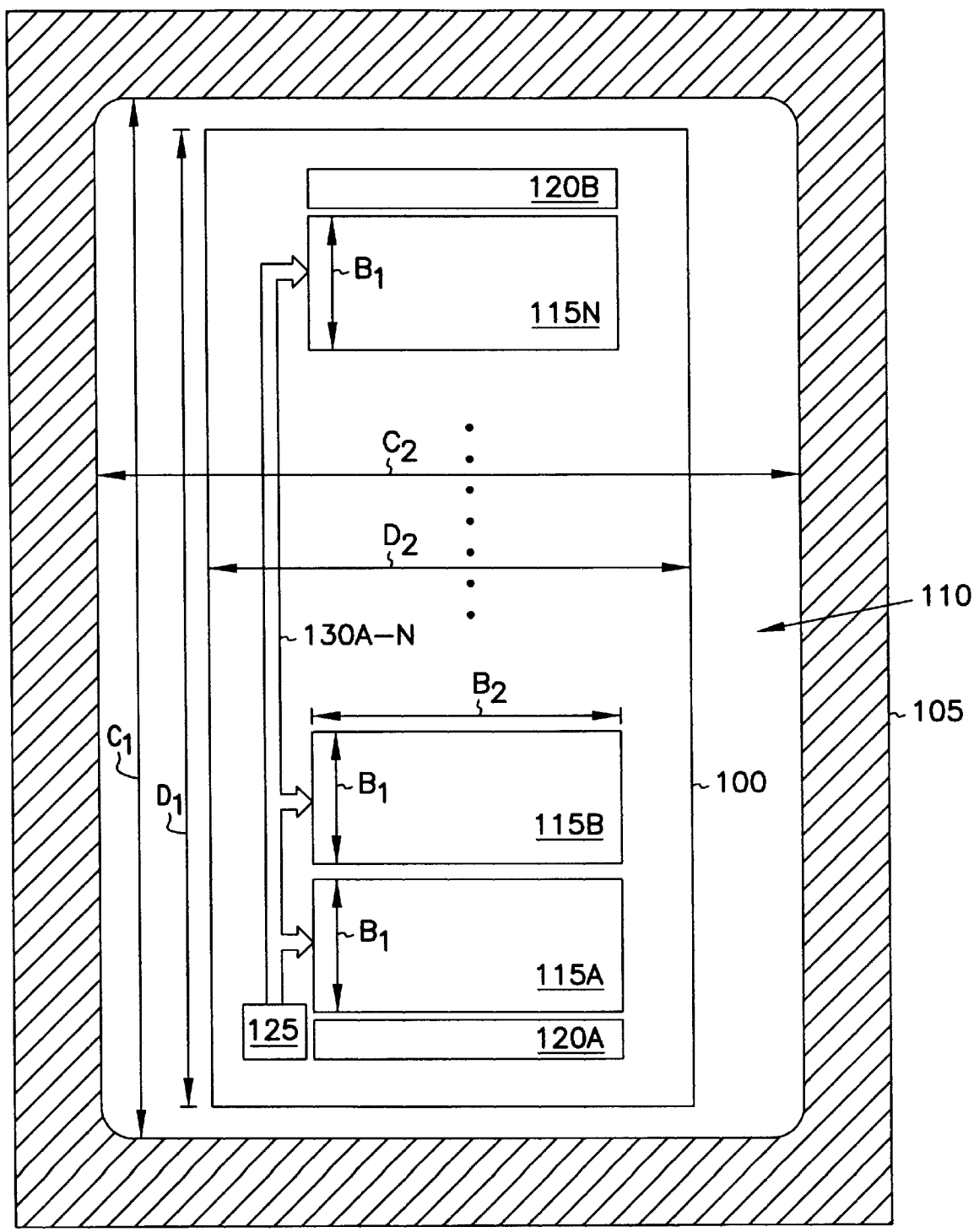
FIG. 1 is a schematic/block diagram illustrating generally a memory integrated circuit (IC) and an IC carrier according to one aspect of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Optimized Memory Architecture

FIG. 1 is a schematic/block diagram illustrating generally one embodiment of a memory integrated circuit (IC) 100 die and an IC carrier, such as package 105, according to one aspect of the present invention. Memory IC 100 includes an EEPROM, DRAM, SRAM, or any other memory configuration. Package 105 includes a thin small outline package (TSOP), dual inline package (DIP), ball grid array (BGA), or any other package for carrying memory IC 100.

In one embodiment, memory IC 100 is disposed on an area 110 provided by a cavity in package 105. For example, adhesive or other bonding techniques are used to mount memory IC 100 within the cavity of package 105. The area 110 provided by the cavity has a size C, and memory IC 100 has a die size $D_1$, each in a first dimension of the illustration of FIG. 1. However, the area 110 on which memory IC 100 is disposed need not be a cavity. For example, a chip-scale package 105 includes a plate, and not a cavity, providing and defining the area 110 on which memory IC 100 is disposed. In an alternative embodiment, memory IC 100 is disposed on an area 110 provided by a rigid or flexible interposer (e.g., ceramic or organic) on a printed circuit board (PCB) or other IC carrier. Thus, although the present application describes with particularity certain embodiments including a package having a cavity, the present invention is not so limited. Instead, in the present application, the terms "area" and "cavity" are used interchangeably to describe any area on an IC carrier on or in which the memory IC 100 is disposed.

Memory IC 100 includes N memory blocks 115A, 115B,. . .,115N. Memory blocks 115A–N are arranged in a row in the first dimension of FIG. 1 (i.e., in the direction of $C_1$ and $D_1$). Each memory block 115 has a block size $B_1$ in the first dimension of FIG. 1 (i.e., in the direction of $C_1$ and $D_1$). Each of memory blocks 115A–N includes a plurality of W memory cells, with each memory cell capable of storing 1 bit of data. In one embodiment, W is an even power of two (i.e., $\log_2(W)$ is an integer), although this is not required to practice the invention.

Memory IC 100 also includes first peripheral circuit 120A and optionally also includes second peripheral circuit 120B. First peripheral circuits 120A includes, for example, a memory cell address predecoders for addressing or accessing the memory cells in particular memory blocks 115A–N, such as by using addressing lines oriented generally in the first dimension of FIG. 1 and overlaying the memory blocks 115. First and second peripheral circuits 120A–B can also include test logic, charge pumps, sequencing circuits, or any other circuits performing functions of memory IC. Memory IC 100 also includes block decoder 125 for selecting a particular one of memory blocks 115A–N and deselecting the others of memory blocks 115A–N.

According to one aspect of the invention, the number of memory blocks, N, is not necessarily an even power of two. More particularly, $\log_2(N)$ is a noninteger in one embodiment of the invention. By contrast, conventional memories typically include memory cells arranged in a number of memory blocks, M, where M is an even power of two. As a result, for a conventional memory, $\log_2(M)$ is an integer. This allows the M blocks of a conventional memory to be selected by decoding $\log_2(M)$ block address bits into M block decode lines.

By contrast, one aspect of the present invention recognizes that placing memory IC 100 in a standardized package 105, having a predetermined area 110 and size $C_1$, results in wasted space. In the first dimension of FIG. 1, this wasted space is represented by the difference between the size $C_1$ and the die size $D_1$, that is $(C_1-D_1)$. According to one aspect of the invention, the number of memory blocks, N, is selected in order to minimize the wasted space represented by the difference $(C_1-D_1)$.

In one embodiment, for a particular package 105 and size $C_1$, the maximum number of memory blocks, N, is selected such that $(C_1-D_1)$ is approximately less than $B_1$ (i.e., further adding another memory block 115 would increase the die size $D_1$ such that memory IC 100 would no longer fit within size $C_1$ of area 110 of package 105). It is understood that there may also be certain process tolerances, such as for die placement, that may still require some minimum value of the difference $(C_1-D_1)$ in order to properly place the memory IC 100 within the area 110 of package 105.

Moreover, it is understood that the present invention allows N to be selected so as to decrease the wasted space. The selection of the difference $(C_1-D_1)$ to be approximately less than $B_1$ represents an upper value for efficient utilization of space. However, N need not be selected such that $(C_1-D_1)$ is approximately less than $B_1$. Smaller values of N can be used with a particular cavity size, with a corresponding decrease in obtained storage density for the particular package 105. However, such smaller values of N need not be an even power of two, as discussed above.

The present invention provides, among other things, increased data storage capacity contained in a particular package 105. This, in turn, provides more storage capacity per unit volume in a computer system, communication system, or other electronic device using the memory IC 100 and package 105. Moreover, the present invention offers the ability to increase such density of such data storage functionality while allowing the computer system, communication system, or other electronic device to be designed using a standard package 105. As a result, the system or device can be designed even before the design of memory IC 100. Such concurrent design flexibility is particularly important for timely introduction of such products to the market.

Although the memory architecture of the present invention is described above with respect to a particular orientation of memory IC 100 within area 110 of package 105, memory IC 100 can be differently oriented within package 105. In one embodiment, for example, memory IC 100 is rotated by 90 degrees, and the number of memory blocks N selected such that $(C_2-D_1)$ is approximately less than $B_1$, where $C_2$ is a size of area 110 in a direction substantially orthogonal to $C_1$. Moreover, for the orientation illustrated in FIG. 1, a block size $B_2$, in a direction that is substantially orthogonal to block size $B_1$, can also be adjusted. In one embodiment, for example, block size $B_2$ is increased to minimize the wasted space illustrated by the difference $(C_2-D_2)$, where D2 is a die size in a direction that is substantially orthogonal to $D_1$. Alternatively, or in combination, for a particular predetermined number of memory cells in each block 115, block size $B_2$ is increased. As a result, block size $B_1$ is decreased. Then, the number of memory blocks N is selected such that $(C_1-D_1)$ is approximately less than $B_1$. This also minimizes wasted space illustrated by the difference $(C_1-D_1)$.

Address Decoding Examples

As described above, in certain embodiments of the present invention, the number of memory blocks, N, is not an even power of two (i.e., $\log_2(N)$ is not an integer). Unlike a conventional memory, in which M memory blocks are selected by decoding $\log_2(M)$ block address bits, one embodiment of the present invention decodes a number, B, of block address bits into N block decode lines 130A, 130B, . . . ,130N. Each block decode line 130 is coupled to one of the N memory blocks 115A–N, where $(2)^B>N$. For example, a byte-addressable 5 megabyte memory IC 100, comprising N=10 blocks of 512 kilobytes each, uses B=4 block address bits. The 4 block address bits are decoded into 10 block decode lines 130, each block decode line 130 corresponding to one of the N=10 memory blocks 115. In another example, a byte-addressable 6 megabyte memory IC 100, comprising N=6 blocks of 1 megabyte each, uses B=3 block address bits. The 3 block address bits are decoded into 6 block decode lines 130, each block decode line 130 corresponding to one of the N=6 blocks 115. In another example, a byte-addressable 1 megabyte memory IC 100 comprises N=7 blocks of 128 Kilobytes each, and further comprises an additional 128 kilobyte memory block, arranged in a row in the first dimension together with the N=7 memory blocks. The additional 128 kilobyte memory block, however, is not addressable as a block, but instead includes a plurality of subblocks that are independently addressable. Such independently addressable subblocks include, for example, a 16 kilobyte boot block and two 8 kilobyte parameter blocks.

Figure 2:
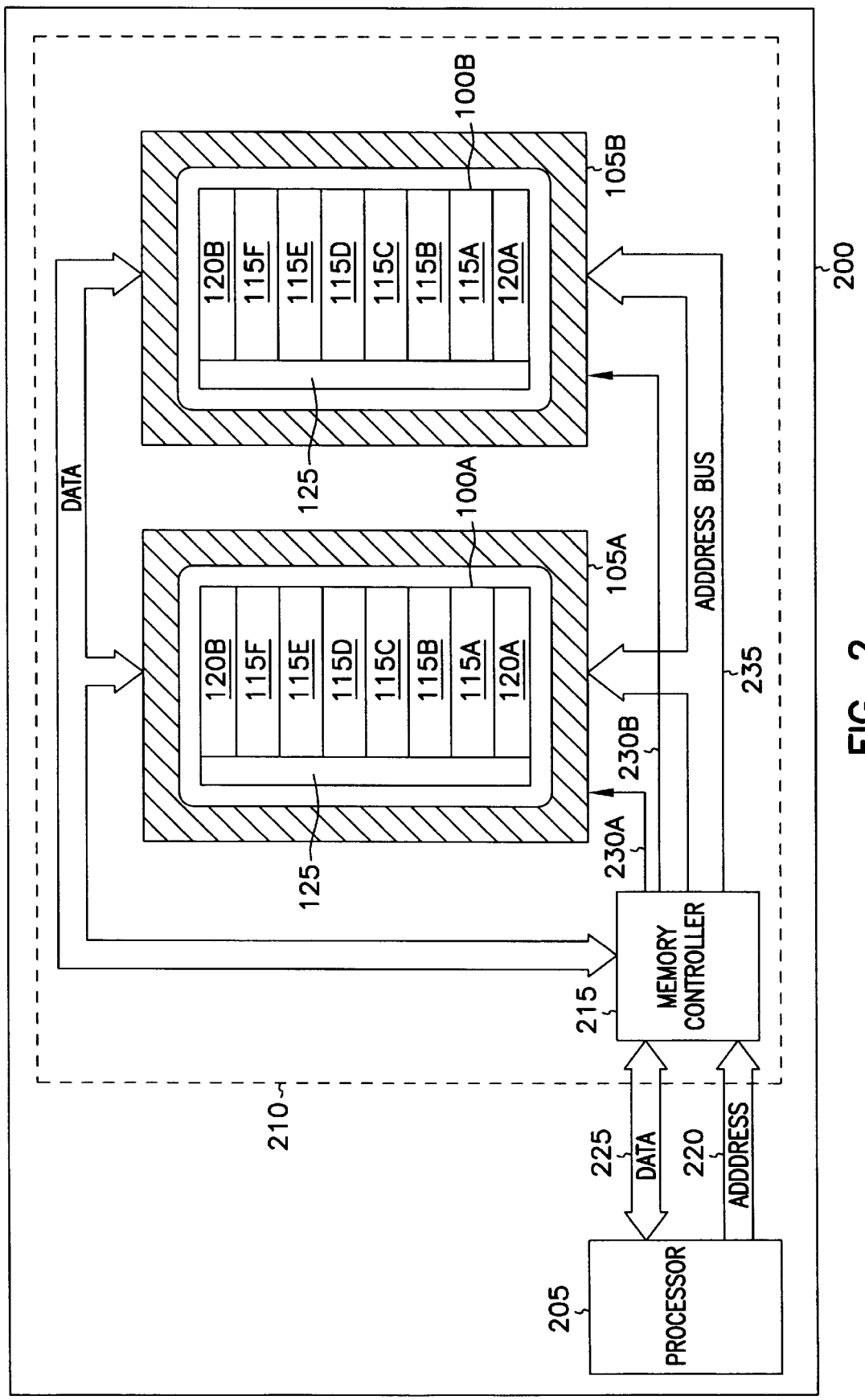
FIG. 2 is a schematic/block diagram illustrating generally a computer system, communication system, or other electronic system including a memory IC according to another aspect of the present invention.

FIG. 2 is a schematic/block diagram illustrating generally one embodiment of a system 200 (e.g., computer system, communication system, or other electronic system or device). In this embodiment, system 200 includes processor 205 and a printed circuit board memory card 210. Memory card 210 includes a memory controller 215 and a plurality of memory ICs 100 in corresponding packages 105. FIG. 2 illustrates by way of example, but not by way of limitation, a particular embodiment of the present invention providing 12 megabytes of data storage on two byte-addressable memory ICs 100A–B. Each of memory ICs 100A–B includes N=6 memory blocks 115A–F. Each memory block 115A–F includes 1 megabyte of memory cells. Processor 205 addresses the memory cells through controller 215. Processor 205 accesses controller 215 via 24 bit address bus 220, which provides address bits A23, A22, . . . A1, A0. The combination of these address bits A23, A22, . . . A1, A0 specifies the address of a particular storage byte of memory card 210.

Processor 205 accesses the memory cells through controller 215 via 8 bit data bus 225.

Controller 215 decodes portions of the 24 bit address, received at A=24 address inputs from processor 205, into individual chip select lines 230A–B. Chip select lines 230A–B are respectively coupled to corresponding memory ICs 100A–B. Chip select lines 230A–B are individually activated to allow data to be accessed from the corresponding one of memory ICs 100A–B. Controller 215 is independently coupled to each of the chip select lines 230A–B of the X=2 memory ICs 100A–B. Controller 215 selects between the chip select lines 230A–B by decoding a number Y=3 of the A=24 address inputs. The above-recited numerical values for A, X, and Y are recited by way of example only, and not by way of limitation. Other values are also possible wherein, in one embodiment of the invention, the relationship $Y>\log_2(X)$ is satisfied.

Controller 215 also decodes the A=24 bit address received from processor 205 into addressing lines of address bus 235. Address bus 235 is coupled to each memory IC 100. Using the signals received from address bus 235, particular memory blocks 115 are selected by its associated block decoder 125 and particular memory cells are selected by its associated memory cell decoders in the peripheral circuits 120A–B. Table 1 illustrates a continuous address field embodiment decoding of particular address bits A23, A22, . . . A1, A0 by memory controller 215.

TABLE 1

Example of Continuous Address Field Decoding For Two 6-MByte ICs Using 1-MByte blocks (As Generated by Controller 215)

| Memory Range (MBytes) | Memory IC Select Bits | | | | Memory IC | Memory Block |
|---|---|---|---|---|---|---|
| | | Block Select Bits | | | | |
| | A23 | A22 | A21 | A20 | | |
| 0–1 | 0 | 0 | 0 | 0 | 100A | 115A (0) |
| 1–2 | 0 | 0 | 0 | 1 | 100A | 115B (1) |
| 2–3 | 0 | 0 | 1 | 0 | 100A | 115C (2) |
| 3–4 | 0 | 0 | 1 | 1 | 100A | 115D (3) |
| 4–5 | 0 | 1 | 0 | 0 | 100A | 115E (4) |
| 5–6 | 0 | 1 | 0 | 1 | 100A | 115F (5) |
| 6–7 | 0 | 1 | 1 | 0 | 100B | 115E (4) |
| 7–8 | 0 | 1 | 1 | 1 | 100B | 115F (5) |
| 8–9 | 1 | 0 | 0 | 0 | 100B | 115C (2) |
| 9–10 | 1 | 0 | 0 | 1 | 100B | 115D (3) |
| 10–11 | 1 | 0 | 1 | 0 | 100B | 115A (1) |
| 11–12 | 1 | 0 | 1 | 1 | 100B | 115B (2) |

Controller 215 selects between memory IC 100A and memory IC 100B using bits A23, A22, and A21, such as according to the Boolean expressions of Equations 1 and 2.

$$100A = (\overline{A23} \cdot \overline{A22}) + (\overline{A23} \cdot A22 \cdot \overline{A21}) \qquad (1)$$

Figure 3:
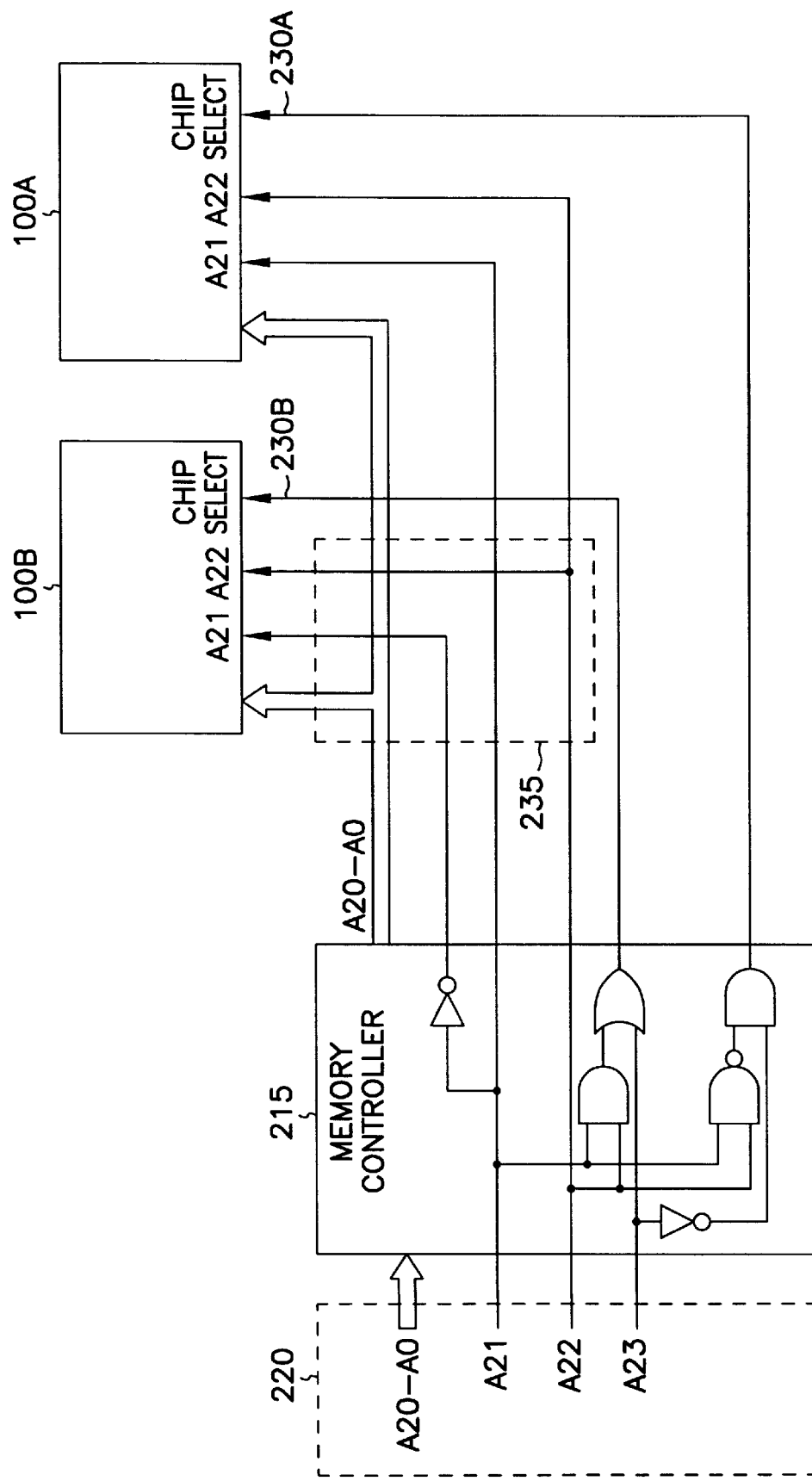
FIG. 3 is a schematic diagram illustrating generally one embodiment of logic in a memory controller.

FIG. 3 is a schematic diagram illustrating generally one embodiment of a logic circuit implementation, in memory controller 215, that selects between memory IC 100A and memory IC 100B according to Equations 1 and 2 and Table 1. Block decoder 125 selects between blocks 115A–F, such as by using block decoding $$100B = (\overline{A23} \cdot A22 \cdot A21) + (A23 \cdot \overline{A22}) \quad (2)$$

bits A22, A21, and A20. According to one aspect of the invention, particular ones of the block decoding bits are differently delivered to the different memory ICs 100A–B. In one embodiment, memory controller 215 is independently coupled to at least one of block address inputs of the first and second memory ICs 100A–B. In other words, certain block decoding bits are provided through connections that are dedicated to a particular one of the memory ICs 100A–B. For example, in FIG. 3, block decoding bit A21 of the input addressed received by memory controller 215 is differently decoded for memory IC 100A than it is for memory IC 100B. In order to obtain the mapping of Table 1, block decoding bit A21 is inverted for delivery to memory IC 100B, but not to memory IC 100A, using separate connections as seen in FIG. 3.

Figure 4:
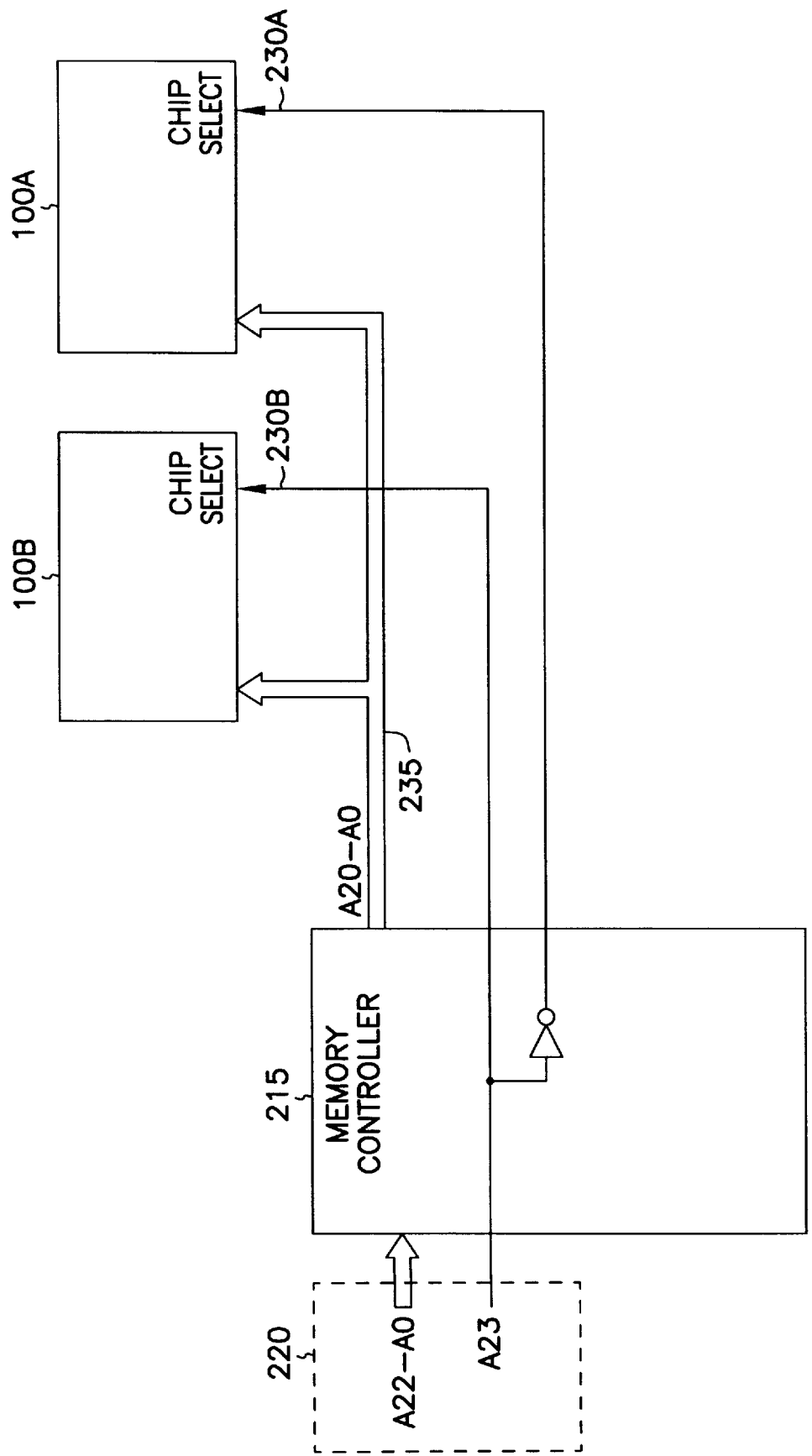
FIG. 4 is a schematic diagram illustrating generally another embodiment of logic in a memory controller.

Table 2 illustrates an alternative embodiment of decoding by memory controller 215, resulting in a discontinuous address field. FIG. 4 is a schematic diagram illustrating generally one embodiment of a logic circuit implementation, in memory controller 215, that selects between memory IC 100A and memory IC 100B according to Table 2.

TABLE 2

Example of Discontinuous Address Field Decoding For Two 6-MByte ICs Using 1-MByte blocks

| Memory Range (MBytes) | Memory IC Select Bits | Block Select Bits | | | Memory IC | Memory Block |
|---|---|---|---|---|---|---|
|  | A23 | A22 | A21 | A20 |  |  |
| 0–1 | 0 | 0 | 0 | 0 | 100A | 115A (0) |
| 1–2 | 0 | 0 | 0 | 1 | 100A | 115B (1) |
| 2–3 | 0 | 0 | 1 | 0 | 100A | 115C (2) |
| 3–4 | 0 | 0 | 1 | 1 | 100A | 115D (3) |
| 4–5 | 0 | 1 | 0 | 0 | 100A | 115E (4) |
| 5–6 | 0 | 1 | 0 | 1 | 100A | 115F (5) |
| 6–7 |  |  |  |  | NOT USED |  |
| 7–8 |  |  |  |  | NOT USED |  |
| 8–9 | 1 | 0 | 0 | 0 | 100B | 115A (0) |
| 9–10 | 1 | 0 | 0 | 1 | 100B | 115B (1) |
| 10–11 | 1 | 0 | 1 | 0 | 100B | 115C (2) |
| 11–12 | 1 | 0 | 1 | 1 | 100B | 115D (3) |
| 12–13 | 1 | 1 | 0 | 0 | 100B | 115E (4) |
| 13–14 | 1 | 1 | 0 | 1 | 100B | 115F (5) |

The above examples describes specific embodiments in which N=6 memory blocks 115 are individually selected by decoding B=3 address bits A22, A21, and A20. It is seen that, for the embodiment of the the present invention that is illustrated in FIG. 3, $(2)^{(B=3)} > (N=6)$, or alternatively, $(B=3) > \log_2(6)$. However, certain embodiments of the present invention also include other values of N and B, with $(2)^B > N$, or alternatively, $B > \log_2(N)$. Similarly, the above examples describes specific embodiments in which Y=2 memory ICs 100 are individually selected by decoding C=3 address bits A23, A22, and A21. The present invention also includes other embodiments in further memory ICs 100 are added (i.e., Y>2) and additional address bits are decoded in order to select individual memory ICs 100. The present invention also includes embodiments including other values of N and B, in which $(2)^B = N$, such as illustrated in FIG. 4.

The above examples also illustrate another aspect of the invention, providing a plurality of X=2 memory ICs 100. Each memory IC 100 includes a number Y=6 Meg of directly addressable (e.g., byte addressable) storage bytes), in which $\log_2(Y)$ is a noninteger. The invention also includes a memory controller 215. The A=24 address bits are capable of being decoded into 16 Meg of addresses. However, controller 215 decodes A=24 address inputs into X·Y=12 Meg of addresses, leaving $(2)^A - (X \cdot Y) = 4$ Meg addresses unused. In the example of Table 1, the address range 1–12 Megabytes is used, and the address range 13–16 Megabytes is unused. This example provides a continuous address field. In the example of Table 2, the address ranges 1–6 Megabytes and 9–14 Megabytes are used, and the address ranges 7–8 Megabytes and 15–16 Megabytes are unused. This address provides a discontinuous address field. While the above aspect of the invention is discussed using particular values for X, Y, and A, other values could also be used, in which $\log_2(Y)$ is a noninteger.

Another aspect of the invention includes using the above-described addressing techniques to address memory ICs that have been tested and found to have faulty memory cells. Such faulty memory cells can be mapped to the unused memory ranges, as described above. In this embodiment, the invention includes Y directly addressable functional storage locations, wherein $\log_2(Y)$ is a noninteger. In other words, the total number of directly accessible storage locations may be an even power of two, but the number of operable storage locations is not an even power of two. Similarly, the invention includes N functional storage blocks, wherein $\log_2(N)$ is a noninteger. In other words, the total number of storage blocks may be an even power of two, but the number of operable storage blocks is not an even power of two.

Layout Optimization

Figure 5:
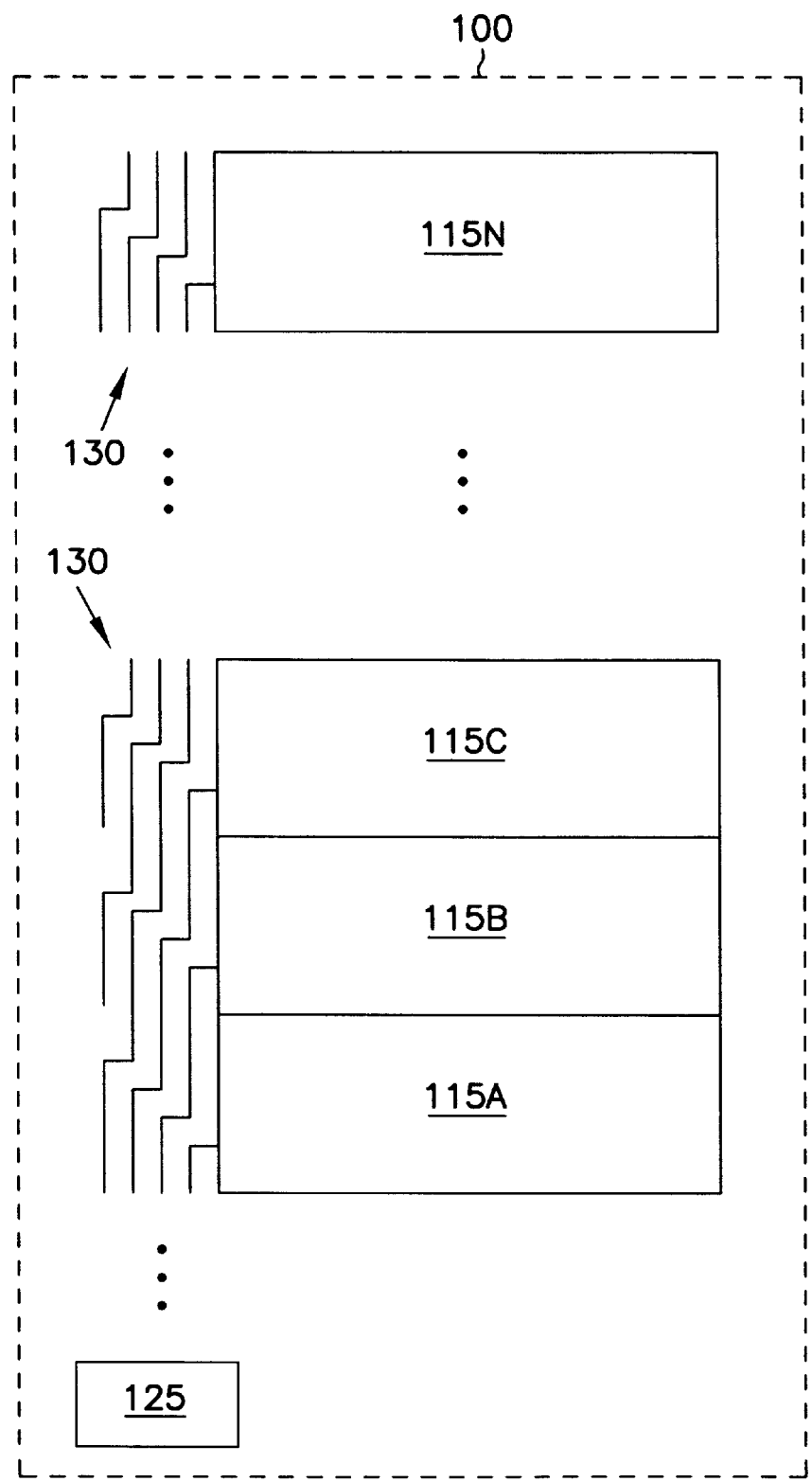
FIG. 5 is a layout floorplan illustrating generally an example arrangement of several memory blocks according to a further aspect of the present invention.

FIG. 5 is a layout floorplan illustrating generally, by way of example, but not by way of limitation, one embodiment of an arrangement of several memory blocks 115. In FIG. 5, each memory block 115 provides corresponding staggered block decode lines 130 for individually coupling memory block decoder 125 to respective memory blocks 115A–N. The staggered block decode lines 130 of FIG. 3 advantageously allows memory blocks 115 and adjacent segments of decode lines 130 to be duplicated and juxtaposed. Identical configurations of memory blocks 115 and adjacent segments of block decode lines 130 are obtained. These identical configurations simplify the task of verifying connections between particular memory blocks 115 and adjacent block decode lines 130.

Conclusion

The present invention provides, among other things, an optimized memory architecture and addressing for maximizing the utilization of space of the memory integrated circuit within an area of a standard integrated circuit package, thereby minimizing wasted space. The present invention allows an electronic product to be designed with standardized integrated circuit packages, increasing the product's functionality and decreasing its volume. Many applications exist for the present invention. For example, the packaged memory ICs can be arranged on a printed circuit board (PCB), such as a Personal Computer Memory Card International Association (PCMCIA) card, providing a removable, high density, high capacity, credit-card size nonvolatile flash memory for laptop computers or other applications.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus comprising:
    a memory integrated circuit (IC), the memory IC including a plurality of N memory blocks arranged in a row in a first dimension, wherein $\log_2(N)$ is a noninteger, the memory blocks including a block size $B_1$ in the first dimension, and each memory block including a plurality of memory cells;
    an IC carrier, the IC carrier including an area carrying the memory IC; and
    wherein the area includes a size $C_1$ in the first dimension, and the memory IC includes a die size $D_1$ in the first dimension, wherein $(C_1-D_1)$ is approximately less than $B_1$.

2. The apparatus of claim 1, in which the IC carrier includes an IC package, and the area includes a cavity in the package, the cavity carrying the memory IC.

3. The apparatus of claim 1, in which the IC carrier include a printed circuit board (PCB) carrying the memory IC.

4. The apparatus of claim 1, in which the memory IC includes a first peripheral circuit located adjacent to a first end of the row of memory blocks.

5. The apparatus of claim 4, in which the memory IC includes a second peripheral circuit located adjacent to a second end, opposing the first end, of the row of memory blocks.

6. The apparatus of claim 1, in which the memory IC includes:
    a plurality of N memory block decode lines, each memory block decode line coupled to one of the memory blocks for selecting the one of the memory blocks; and
    a memory block decoder, having outputs coupled to the memory block decode lines, and having B address inputs for addressing the memory blocks via ones of the N memory block decode lines, wherein $(2)^B>N$.

7. The apparatus of claim 6, in which the memory block decode lines extend generally in the first dimension.

8. The apparatus of claim 7, in which the memory block decode lines are arranged in a staggered configuration.

9. The apparatus of claim 1, further comprising a computer system including a processor communicatively coupled to the memory IC.

10. The apparatus of claim 1, further comprising a plurality of the memory ICs, a memory controller coupled to the memory ICs, and a processor coupled to the memory controller.

11. The apparatus of claim 1, further comprising a PCMCIA card carrying a plurality of the memory ICs.

12. A system that includes first and second ones of the apparatus of claim 1, including respective first and second memory ICs, wherein each of the first and second memory ICs includes a plurality of memory blocks, each memory block including a plurality of memory cells, the first and second memory ICs each also including a chip select input, B block address inputs, and a plurality of memory cell address inputs and further comprising a memory controller, independently coupled to at least one of the B block address inputs in at least one of the first and second memory ICs.

13. The system of claim 12, in which each of the first and second memory ICs includes a block decoder for addressing a particular one of the memory blocks based on signals received at the B block address inputs.

14. The system of claim 12, in which the memory controller includes a logic circuit for selecting between the first and second memory ICs based on an input address.

15. The system of claim 12, further comprising a printed circuit board (PCB) 10 carrying the first and second memory ICs.

16. The system of claim 12, further comprising a PCMCIA card carrying the first and second memory ICs.

17. The system of claim 12, further comprising a computer system including a processor communicatively coupled to the memory IC.

18. The apparatus of claim 1, further comprising at least one additional memory block, arranged in a row in the first dimension together with the N memory blocks, the at least one additional memory block including a block size $B_1$ in the first dimension and also including a plurality of independently addressable subblocks.

19. An apparatus comprising:
    a plurality of X memory ICs, each memory IC including a chip select input and a plurality of other memory cell address inputs, wherein data is accessed on a particular one of the memory ICs only when the chip select input is active, and in which at least one of the memory ICs has a plurality of N memory blocks, wherein $\log_2(N)$ is a noninteger, and the plurality of N memory blocks is arranged in a row in a first dimension, the memory blocks including a block size $B_1$ in the first dimension, and each memory block including a plurality of memory cells; and
    a memory controller, having a plurality of address inputs for receiving an input address, and having a plurality of address outputs for addressing the memory ICs, the memory controller being independently coupled to each chip select input and selecting between the chip select inputs by decoding Y address inputs, wherein $Y>\log_2(X)$;
    an IC carrier, the IC carrier including an area carrying the memory IC having the N memory blocks; and
    wherein the area includes a size $C_1$ in the first dimension, and the memory IC having the N memory blocks includes a die size $D_1$ in the first dimension, wherein $(C_1-D_1)$ is approximately less than $B_1$.

20. The apparatus of claim 19, further comprising a printed circuit board (PCB) carrying the plurality of memory ICs.

21. The apparatus of claim 19, further comprising a PCMCIA card carrying the memory ICs.

22. The apparatus of claim 19, further comprising a computer system including a processor communicatively coupled to the memory Ics.

23. The apparatus of claim 19, further comprising at least one additional memory block, arranged in a row in the first dimension together with the N memory blocks, the at least one additional memory block including a block size $B_1$ in the first dimension and also including a plurality of independently addressable subblocks.

24. An apparatus comprising:
    a plurality of X memory ICs, each memory IC having Y directly addressable storage locations, wherein $\log_2(Y)$ is a noninteger and each memory IC includes a chip select input and a plurality of other memory cell address inputs, wherein data is accessed on a particular one of the memory ICs only when the chip select input is active, and at least one of the memory ICs has a plurality of N memory blocks and $\log_2(N)$ is a noninteger, and the plurality of N memory blocks is arranged in a row in a first dimension, the memory blocks including a block size $B_1$ in the first dimension, and each memory block including a plurality of memory cells; and a memory controller, the memory controller decoding A address inputs into (X)(Y) addresses and leaving $(2)^A - \{(X)(Y)\}$ addresses unused, wherein the memory controller is independently coupled to each chip select input and selects between the chip select inputs by decoding a number Y of the A address inputs, and $Y > \log_2(X)$;

an IC carrier, the IC carrier including an area carrying the memory IC having the N memory blocks; and wherein the area includes a size $C_1$ in the first dimension, and the memory IC having the N memory blocks includes a die size $D_1$ in the first dimension, wherein $(C_1-D_1)$ is approximately less than $B_1$.

25. The apparatus of claim 24, further comprising a printed circuit board (PCB) carrying the memory ICs.

26. The apparatus of claim 24, further comprising a PCMCIA card carrying the memory ICs.

27. The apparatus of claim 24, further comprising a computer system including a processor communicatively coupled to the memory IC.

28. The apparatus of claim 24, further comprising at least one additional memory block, arranged in a row in the first dimension together with the N memory blocks, the at least one additional memory block including a block size $B_1$ in the first dimension and also including a plurality of independently addressable subblocks.

29. A method comprising:

forming a memory integrated circuit (IC) including a plurality of N memory blocks arranged in a row in a first dimension, wherein $\log_2(N)$ is a noninteger, the memory IC having a die size $D_1$ in the first dimension, the memory blocks including a block size $B_1$ in the first dimension, and each memory block including a plurality of memory cells; and disposing the memory IC on an area of an IC carrier, the area having a size $C_1$ in the first dimension, wherein $(C_1-D_1)$ is approximately less than $B_1$.

30. The method of claim 29, in which disposing the memory IC on an area includes disposing the memory IC in a cavity of an integrated circuit package.

31. The method of claim 29, wherein disposing the memory IC on an area includes disposing the memory IC on a printed circuit board (PCB).

* * * * *

UNITED STATES PATENT AND TRADEMARK OFFICE
CERTIFICATE OF CORRECTION

PATENT NO.     : 6,188,595 B1                                        Page 1 of 1
DATED          : February 13, 2001
INVENTOR(S)    : Chevallier It is certified that error appears in the above-identified patent and that said Letters Patent is hereby corrected as shown below:

In column 1, line 43, delete "Modem" and insert --Modem--, therefor.

In column 4, line 11, delete "includes" and insert --include--, therefor.

In column 4, line 11, delete "a".

In column 5, line 21, delete "D2" and insert --$D_2$--, therefor.

In column 6, lines 10 and 11, delete ¶ between "card 210." and "Processor 205".

In column 7, line 15, delete "addressed" and insert --address--, therefor.

In column 7, line 50, delete "examples" and insert --example--, therefor.

In column 7, line 53, delete "the the" and insert --the--, therefor.

In column 7, line 57, delete "examples" and insert --example--, therefor.

In column 7, line 61, insert --which--after "in".

Column 8, line 2, insert --locations (e.g., storage--after "storage".

Signed and Sealed this

Fifth Day of June, 2001

*Attest:*

*Attesting Officer*

NICHOLAS P. GODICI
*Acting Director of the United States Patent and Trademark Office*